(12) United States Patent
Nasuno et al.

(10) Patent No.: US 8,258,596 B2
(45) Date of Patent: Sep. 4, 2012

(54) STACKED PHOTOELECTRIC CONVERSION DEVICE AND METHOD FOR PRODUCING THE SAME

(75) Inventors: Yoshiyuki Nasuno, Osaka (JP); Noriyoshi Kohama, Osaka (JP); Takanori Nakano, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 312 days.

(21) Appl. No.: 12/523,633

(22) PCT Filed: Nov. 15, 2007

(86) PCT No.: PCT/JP2007/072207
§ 371 (c)(1),
(2), (4) Date: Jul. 17, 2009

(87) PCT Pub. No.: WO2008/090666
PCT Pub. Date: Jul. 31, 2008

(65) Prior Publication Data
US 2010/0059847 A1 Mar. 11, 2010

(30) Foreign Application Priority Data
Jan. 23, 2007 (JP) ................................. 2007-012851

(51) Int. Cl.
*H01L 31/103* (2006.01)
*H01L 21/329* (2006.01)
(52) U.S. Cl. ......... 257/458; 257/E31.057; 257/E21.352; 257/E31.047; 438/74; 438/96
(58) Field of Classification Search .................. 257/668, 257/724, 778–780, 786, E23.02, E23.069; 438/106–109
See application file for complete search history.

(56) References Cited

U.S. PATENT DOCUMENTS

| 5,032,884 | A | * | 7/1991 | Yamagishi et al. | ............ | 257/458 |
| 5,602,418 | A | * | 2/1997 | Imai et al. | ...................... | 257/627 |
| 7,619,267 | B2 | * | 11/2009 | Araki | ............................. | 257/292 |
| 7,842,988 | B2 | * | 11/2010 | Okagawa et al. | ............. | 257/292 |

(Continued)

FOREIGN PATENT DOCUMENTS

| JP | 2003-124481 | | 4/2003 |
| JP | 2003124481 | * | 4/2003 |
| JP | 2003-347572 | | 12/2003 |
| JP | 2004-128083 | | 4/2004 |
| JP | 2004-363580 | | 12/2004 |

OTHER PUBLICATIONS

Supplementary European Search Report mailed Jun. 15, 2010 in corresponding EP application 07831937.3.

(Continued)

*Primary Examiner* — Thao Le
*Assistant Examiner* — Sheng Zhu
(74) *Attorney, Agent, or Firm* — Nixon & Vanderhye P.C.

(57) ABSTRACT

To provide a stacked photoelectric conversion device and a method for producing the same, in which an interlayer is provided between photoelectric conversion layers to obtain an effect of controlling the amount of incidence light, and carrier recombination at an interface between the interlayer and a semiconductor layer is decreased to enhance photoelectric conversion efficiency.

The stacked photoelectric conversion device of the present invention comprises a plurality of silicon-based photoelectric conversion layers having a p-i-n structure stacked, wherein at least a pair of adjacent photoelectric conversion layers have an interlayer of a silicon nitride therebetween, the pair of the photoelectric conversion layers are electrically connected with each other, and a p-type silicon-based semiconductor layer constituting a part of the photoelectric conversion layer and contacting the interlayer contains a nitrogen atom.

19 Claims, 3 Drawing Sheets

U.S. PATENT DOCUMENTS

2005/0229965 A1* 10/2005 Nishimura et al. ........... 136/255
2006/0043517 A1* 3/2006 Sasaki et al. .................. 257/458
2009/0047752 A1* 2/2009 Yamazaki et al. .............. 438/96
2009/0166622 A1* 7/2009 Kishimoto et al. ............. 257/49

OTHER PUBLICATIONS

International Search Report for PCT/JP2007/072207, mailed Feb. 26, 2008.

* cited by examiner

STACKED PHOTOELECTRIC CONVERSION DEVICE AND METHOD FOR PRODUCING THE SAME

This application is the U.S. national phase of International Application No. PCT/JP2007/072207 filed 15 Nov. 2007, which designated the U.S. and claims priority to Japan Application No. 2007-012851 filed 23 Jan. 2007, the entire contents of each of which are hereby incorporated by reference.

TECHNICAL FIELD

The present invention at least in part relates to a stacked photoelectric conversion device and a method for producing the same. More particularly, the present invention relates to a stacked photoelectric conversion device having an interlayer between photoelectric conversion layers and a method for producing the same.

BACKGROUND ART

Fossil fuels such as petroleum raise concerns about future depletion and have a problem of carbon dioxide emission causing global warming. In recent years, spread of photovoltaic power systems has been expanded, and they are expected as an energy source alternative to fossil fuels such as petroleum because of increased environmental awareness and low-priced systems in particular.

General solar cells are categorized into bulk solar cells and thin-film solar cells. The bulk solar cells are those produced with the use of single-crystal and polycrystalline silicons or bulk crystalline semiconductors including solar cells of gallium arsenide compounds, and mass production technology has been already established for most of such solar cells. Recently, however, the bulk solar cells have had problems of lack of raw materials due to rapid increase of production volume and difficult cost reduction.

As for the thin-film solar cells, in contrast, quantity of semiconductors to be used can be reduced considerably. Therefore, they attract attention as a next generation of solar cells having a possibility of resolution of the problem of lack of raw materials and significant cost reduction. Specifically, a thickness of a semiconductor layer of the thin-film solar cells is not more than 10 μm to several μm, whereas a thickness of the bulk solar cells is several hundreds μm. Generally, structures of the thin-film solar cells can be categorized into the following two types.

That is, they are categorized into either a superstrate type in which a transparent conductive layer, a photoelectric conversion layer, and a back electrode layer are laminated in this order on a transparent substrate, and light enters from a side of the transparent substrate; or a substrate type in which a back electrode layer, a photoelectric conversion layer, a transparent conductive layer, and a metal grid electrode are laminated in this order on a non-transparent substrate, and light enters from a side of the metal grid electrode.

Since the amount of semiconductors to be used is small in the thin-film solar cells as described above, technologies for effectively utilizing light that enters the semiconductor layer is very important in order to obtain high conversion efficiency. Technologies for that purpose include an optical confinement technology. The optical confinement technology is a technology to enhance photoelectric conversion efficiency by increasing the amount of light absorption by extending a substantial optical path length in the photoelectric conversion layer by forming a structure in which light is refracted and scattered at an interface between the photoelectric conversion layer and a material having a different index of refraction.

In addition, adoption of a structure of a stacked photoelectric conversion device is also a technology for effective use of incident light. The structure of the stacked photoelectric conversion device is a structure for splitting an incident light spectrum and receiving the split light spectrum in a plurality of photoelectric conversion layers, and by stacking a plurality of photoelectric conversion layers that use a semiconductor material having a bandgap suitable for absorbing the respective wavelength bands in decreasing order of bandgap from a light entrance side, it is possible to absorb light having a shorter wavelength in the photoelectric conversion layer having a larger bandgap and light having a longer wavelength in the photoelectric conversion, layer having a smaller bandgap, respectively.

Therefore, sunlight having a wider wavelength band can contribute to the photoelectric conversion compared with a device provided with one photoelectric conversion layer, and therefore it becomes possible to enhance the photoelectric conversion efficiency. Here, since a plurality of photoelectric conversion layers are connected in series in the stacked photoelectric conversion device, the open end voltage will be used without waste as the total of voltages generated in each photoelectric conversion layer, but the short circuit current density will be limited by the smallest value of photocurrents generated in each photoelectric conversion, layer. Therefore, it is an important factor for unwasted utilization of energy of the incident light to equalize photocurrent values generated in each photoelectric conversion layer.

While it is common to control the film thickness of each photoelectric conversion layer as a method for equalizing the photocurrent values generated in each photoelectric conversion layer, it is also known to control the amount of light that enters each photoelectric conversion layer by providing an interlayer between two adjacent photoelectric conversion layers. When the interlayer is provided, some of light that has reached the interlayer is reflected, and the rest of the light is allowed to pass through. Therefore, there is an effect of controlling the amount of incidence light to each photoelectric conversion layer, that is, the amount of the incidence light to a photoelectric conversion layer located at the light entrance side with respect to the interlayer (top cell) is increased, while the amount of the incidence light to a photoelectric conversion layer located at a side opposite to the light entrance side (bottom cell) is decreased. The interlayer is desired to have at least the following two characteristics: to have small light absorption coefficient in a wavelength range in which light in the bottom cell can be absorbed, and to have sufficient electric conductivity to prevent generation of large series resistance. And, materials that meet the requirements are desirably used.

Patent Document 1 discloses a solar cell comprising a plurality of cells of an p-i-n type or an n-i-p type structure of an amorphous Si or a crystalline Si laminated into a plurality of stages on a glass substrate via a transparent electrode layer, wherein at least a pair of adjacent cells partially contact with each other via an aperture hole in an insulation film formed between the cells, and Patent Document 1 exemplifies an oxide film, a nitride film, and a carbide film as the insulation film. With this configuration, according to the document, adjacent cells are point-contacted to enable reduction of shortening of the diffusion length of optically generated carriers due to a non-bonding hand at an interface between layers of each cell of different materials. In addition, such a configuration in which a plurality of cells are provided with an insulation film therebetween produces the above-mentioned effect of controlling the amount of incident light.

[Patent Document 1] Japanese Unexamined Patent Publication No. 2003-124481

DISCLOSURE OF THE INVENTION

Problems to be Solved by the Invention

However, the case of the above-described configuration provided with the insulation film has a problem in that a non-bonding hand is generated at the interface due to difference in the material between the insulation film and the Si layer, and carrier recombination at the interface increases to decrease the photoelectric conversion efficiency.

In addition, carriers generated at a lower part of the insulation film lead to a problem of decrease of the photoelectric conversion efficiency, because such carriers conduct in the Si layer that contacts the insulation film up to the aperture hole of the insulation film to increase the probability of the recombination at the interface between the insulation film and the Si layer.

In view of the above-described situation, the present invention at least in part has been achieved to provide a stacked photoelectric conversion device and a method for producing the same, in which an interlayer is provided between photoelectric conversion layers to obtain the above-mentioned effect of controlling the amount of incidence light, and carrier recombination at an interface between the interlayer and a semiconductor layer is decreased to enhance the photoelectric conversion efficiency.

Means for Solving the Problems and Effects of the Invention

According to the present invention, there is provided a stacked photoelectric conversion device comprising a plurality of silicon-based photoelectric conversion layers having a p-i-n structure stacked, wherein at least a pair of adjacent photoelectric conversion layers have an interlayer of a silicon nitride therebetween, the pair of the photoelectric conversion layers are electrically connected with each other, and a p-type silicon-based semiconductor layer constituting a part of the photoelectric conversion layer and contacting the interlayer contains a nitrogen atom.

According to the present invention, the p-type silicon-based semiconductor layer contacting the interlayer of a silicon nitride contains a nitrogen atom, and the interlayer and the p-type silicon-based semiconductor layer are formed of materials of the same kind, thereby reducing non-bonding hands of silicon generated in the vicinity of an interface between the layers. Therefore, it is possible to decrease the carrier recombination and enhance the photoelectric conversion efficiency.

Additionally, in accordance with the present invention, when the interlayer has an aperture, it is possible to adjust the amount of reflected light to a cell (top cell) located at a light entrance side of the interlayer and the amount of incident light to a cell (bottom cell) located at a side opposite to the light entrance side of the interlayer by adjusting the size or the area density of the aperture. Therefore, the aperture can be formed so that the short circuit current density of the top cell and that of the bottom cell are equal, and therefore it is possible to obtain a stacked photoelectric conversion device of high efficiency.

Hereinafter, various preferred embodiments will be exemplified.

The interlayer may have an aperture, and the pair of the photoelectric conversion layers may be electrically connected by contacting with, each other via the aperture. In this case, it is possible to electrically connect the pair of the photoelectric conversion layers each other more securely.

The p-type silicon-based semiconductor layer may contain nitrogen atoms of 0.001 to 10 atomic %. In this case, the effect of decreasing non-bonding hands of silicon is relatively significant (see Table 2).

The interlayer may contain nitrogen atoms of 10 to 60 atomic %. In this case, the difference in the index of refraction between the interlayer and the silicon-based photoelectric conversion layer is relatively large to allow the reflectance at the interface to be relatively large, and the area in which the interlayer is formed can be therefore relatively narrow (see Tables 3 and 4).

The nitrogen atom concentration in the p-type silicon-based semiconductor layer may be distributed to gradually decrease from the interface between the p-type silicon-based semiconductor layer and the interlayer. In this case, the structure in the vicinity of the interface can be gradually changed, and an interface of less strain and less stress can be formed, thereby achieving prevention of peel-off of a film and enhancement of the photoelectric conversion efficiency.

The p-type silicon-based semiconductor layer may be a hydrogenated silicon layer. In this case, material compositions of the interlayer and the p-type silicon-based semiconductor layer are relatively similar, and defects due to non-bonding hands are therefore unlikely to occur at the interface between the layers, allowing reduction of carrier recombination.

The hydrogenated silicon layer may contain a crystalline silicon. Since the bandgap of crystalline silicons is generally narrower than that of amorphous silicons, the bandgap of the hydrogenated silicon layer can be adjusted by adjusting the content of the crystalline silicon.

The part where the p-type silicon-based semiconductor layer contacts the interlayer may be 1 mm or less. Since carrier recombination is likely to occur in the part where the p-type silicon-based semiconductor layer contacts the interlayer, the carrier recombination can be prevented by narrowing the width of this part, thereby enhancing the photoelectric conversion efficiency (see Table 1).

Of the pair of the photoelectric conversion layers, one at the light entrance side of the interlayer may have an i-type hydrogenated amorphous silicon, and the other may have an i-type hydrogenated microcrystalline silicon. In this case, the bandgap of the photoelectric conversion layer at the light entrance side can be made wider than that of the photoelectric conversion layer at the side opposite to the light entrance side, and therefore use efficiency of light of a longer wavelength can be improved.

The photoelectric conversion layer having an i-type hydrogenated amorphous silicon may be laminated into a plurality of layers at the light entrance side of the interlayer. In this case, the photoelectric conversion efficiency can be further enhanced (see Tables 3 and 5).

Furthermore, the present invention also provides a method for producing a stacked photoelectric conversion device, the method comprising the steps of: forming a first silicon-based photoelectric conversion layer having silicon-based semiconductor layers of p-type, i-type, and n-type on a substrate via a conductive film; forming an interlayer of a silicon nitride on the photoelectric conversion layer; and forming a second silicon-based photoelectric conversion layer having silicon-based semiconductor layers of p-type, i-type, and n-type on the interlayer in the same order as in the photoelectric conversion layer, wherein the first and second silicon-based photoelectric conversion layers are formed to be electrically connected with each other, and the p-type silicon-based semiconductor layer on the interlayer is formed to contain a nitrogen atom.

In this method, the p-type silicon-based semiconductor layer on the interlayer is formed to contain a nitrogen atom. A method for allowing the p-type silicon-based semiconductor layer to contain a nitrogen atom is not particularly limited, and may be mentioned, for example, (1) a method in which the nitrogen atom concentration in the interlayer is increased, (2) a method in which the p-type silicon-based semiconductor layer is formed in a film forming chamber used for film formation of the interlayer, (3) a method in which a gas containing a nitrogen atom is included in a material gas to be used for formation of the p-type silicon-based semiconductor layer, a combination of any two of these methods, and the like.

In the stacked photoelectric conversion device produced according to the present method, the p-type silicon-based semiconductor layer contacting the interlayer of a silicon nitride contains a nitrogen atom, and the interlayer and the p-type silicon-based semiconductor layer are formed of materials of the same kind. Therefore, non-bonding hands of silicon generated in the vicinity of the interface between the layers can be reduced, thereby decreasing carrier recombination and enhancing the photoelectric conversion efficiency.

The interlayer may have an aperture, and the first and second silicon-based photoelectric conversion layers may be electrically connected by contacting with each other via the aperture. In this case, the first and second silicon-based photoelectric conversion layers can be electrically connected with each other securely.

The interlayer may be formed by a plasma CVD method using a material gas containing an $N_2$ gas and an $SiH_4$ gas, and the gas flow rate ratio of $N_2/SiH_4$ may be 10 or more. In this case, the difference in the index of refraction between the interlayer and the silicon-based photoelectric conversion layer is relatively large to allow the reflectance at the interface to be relatively large, and therefore the area in which the interlayer is formed can be relatively narrow (see Tables 3 and 4).

The interlayer may be formed by a plasma CVD method using a material gas containing an $N_2$ gas and an $SiH_4$ gas, and the gas flow rate ratio of $N_2/SiH_4$ may be in a range of 10 to 500. Since the nitrogen concentration in the interlayer will not be larger any more even if the gas flow rate ratio of $N_2/SiH_4$ is more than 500, it is preferable that the gas flow rate ratio of $N_2/SiH_4$ is 500 or less.

The interlayer may be provided with the p-type silicon-based semiconductor layer formed thereon, and the p-type silicon-based, semiconductor layer may be formed in a film forming chamber used for formation of the interlayer. In this case, some nitrogen atoms introduced at the time of the formation of the interlayer remain in the film forming chamber, and therefore it is possible to allow the p-type silicon-based semiconductor layer to contain a nitrogen atom by forming the p-type silicon-based semiconductor layer in this film forming chamber.

The p-type silicon-based semiconductor layer may be formed by using a cathode electrode and an anode electrode used for the formation of the interlayer. In this case, nitrogen atoms attached at the time of the formation of the interlayer are present in the cathode electrode and the anode electrode, and therefore it is possible to allow the p-type silicon-based semiconductor layer to contain a nitrogen atom by forming the p-type silicon-based semiconductor layer by using the cathode electrode and the anode electrode.

The various embodiments that have been described here can be appropriately combined with one another.

Figure 1:
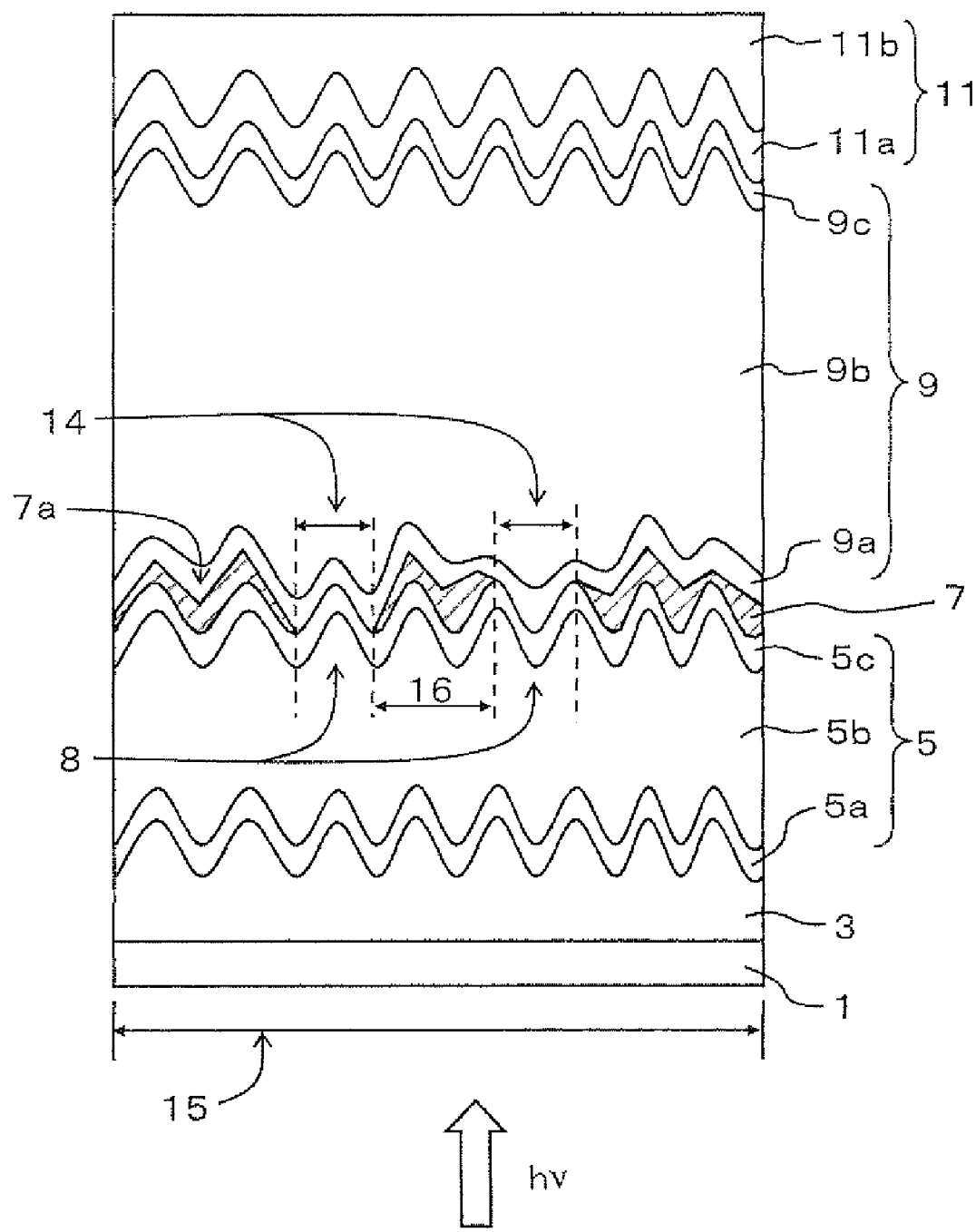
FIG. 1 is a sectional view illustrating a configuration of a stacked photoelectric conversion device according to Embodiment 1 of the present invention.

| DESCRIPTION OF THE REFERENCE NUMERALS | |
|---|---|
| 1 | Transparent substrate |
| 3 | Front transparent conductive layer |
| 5 | First photoelectric conversion layer |
| 5a, 9a | P-type silicon-based semiconductor layer |
| 5b, 9b | I-type silicon-based semiconductor layer |
| 5c, 9c | N-type silicon-based semiconductor layer |
| 5d | Buffer layer |
| 7 | Interlayer |
| 8 | Aperture |
| 9 | Second photoelectric conversion layer |
| 11 | Back electrode layer |
| 11a | Back transparent conductive layer |
| 11b | Conductive layer |
| 14 | Width of each aperture (line) |
| 15 | Width of stacked photoelectric conversion device (line) |
| 16 | Width of part where interlayer and p-type or n-type silicon-based semiconductor layer contact with each other |

BEST MODE FOR CARRYING OUT THE INVENTION

The stacked photoelectric conversion device of the present invention comprises a plurality of silicon-based photoelectric conversion layers having a p-i-n structure (hereinafter, the "silicon-based photoelectric conversion layers having a p-i-n structure" may also be simply referred to as "photoelectric conversion layers") stacked, wherein at least a pair of the adjacent photoelectric conversion layers have an interlayer of a silicon nitride therebetween, the pair of the photoelectric conversion layers are electrically connected with each other, and a p-type silicon-based semiconductor layer constituting a part of the photoelectric conversion layer and contacting the interlayer contains a nitrogen atom.

A method for electrically connecting the pair of the photoelectric conversion layers each other is not particularly limited, and examples thereof may include a method in which the electric resistance of the interlayer in a thickness direction is lowered by, for example, forming the interlayer into a thinner shape to conduct the pair of the photoelectric conversion layers. In addition, the pair of the photoelectric conversion layers may be more readily electrically connected by increasing the concentration of impurities in the p-type silicon-based semiconductor layer and the n-type silicon-based semiconductor layer having the interlayer therebetween. Or, as another example, the pair of the photoelectric conversion layers may be electrically connected by forming an aperture in the interlayer and bringing the photoelectric conversion layers into contact with each other via the aperture. Hereinafter, the latter case will be described for example, but the following description is also true for the former case except for the description of the aperture of the interlayer.

A stacked photoelectric conversion device according to an embodiment of the present invention comprises a plurality of silicon-based photoelectric conversion layers having a p-i-n structure stacked, wherein at least a pair of adjacent photoelectric conversion layers have an interlayer of a silicon nitride therebetween, the interlayer has an aperture, the pair of the photoelectric conversion layers are connected with each other via the aperture, and a p-type silicon-based semiconductor layer constituting a part of the photoelectric conversion layer and contacting the interlayer contains a nitrogen atom. The photoelectric conversion layers may be formed into two layers, three layers, or more layers, as long as at least a pair of adjacent photoelectric conversion layers of those have an interlayer having at least one aperture formed therebetween.

When attention is paid to the pair of silicon photoelectric conversion layers having the interlayer therebetween and having the p-i-n structure, in addition, the stacked photoelectric conversion device of the present invention may be described as comprising: a first photoelectric conversion layer, an interlayer of a silicon nitride, and a second photoelectric conversion layer stacked in this order, wherein the interlayer has at least one aperture, the first and second photoelectric conversion layers contact with each other via the aperture, and a p-type silicon-based semiconductor layer constituting a part of the photoelectric conversion layer and contacting the interlayer contains a nitrogen atom.

Specifically, the stacked photoelectric conversion device of the present invention is practicable in the following embodiments, for example.

1. Embodiment 1

Super-Strate Structure

A photoelectric conversion device according to Embodiment 1 of the present invention comprises: a front transparent conductive layer, a plurality of silicon-based photoelectric conversion layers having a p-i-n structure, and a back electrode layer stacked in this order on a transparent substrate, wherein at least a pair of adjacent photoelectric conversion layers have an interlayer of a silicon nitride therebetween, the interlayer has at least one aperture, and the pair of photoelectric conversion layers (referred to as a first photoelectric conversion layer and a second photoelectric conversion layer from a side of the transparent substrate, respectively) having the interlayer therebetween contact with each other via the aperture, and a p-type silicon-based semiconductor layer constituting a part of the photoelectric conversion layer and contacting the interlayer contains a nitrogen atom.

When attention is paid to the pair of silicon photoelectric conversion layers having the interlayer therebetween and having the p-i-n structure, in addition, the photoelectric conversion device according to the present embodiment may be described as comprising: a front transparent conductive layer, a first photoelectric conversion layer, an interlayer of a silicon nitride, a second photoelectric conversion layer, and a back electrode layer stacked in this order on a transparent substrate, wherein the interlayer has at least one aperture, the first and second photoelectric conversion layers contact with each other via the aperture, and a p-type silicon-based semiconductor layer constituting a part of the photoelectric conversion layer and contacting the interlayer contains a nitrogen atom.

In this case, the transparent substrate side is a light incident surface, and the first photoelectric conversion layer is a top cell and the second photoelectric conversion layer is a bottom cell.

1-1. Transparent Substrate

As the transparent substrate, glass, transparent resins having heat resistance such as polyimide or polyvinyl, or a laminate thereof are suitably used, but the substrate is not particularly limited as long as it has a high light transmitting property and can structurally support the whole photoelectric conversion device. In addition, the substrate may have a metal film, a transparent conductive film, an insulating film, or the like formed on the surface thereof.

1-2. Front Transparent Conductive Layer

The front transparent conductive layer is made of transparent conductive materials, and for example, transparent conductive films such as ITO, tin oxide and zinc oxide may be used. Here, a small amount of impurities may be added to the materials of the front transparent conductive layer. For example, when zinc oxide is a main component, approximately $5 \times 10^{20}$ to $5 \times 10^{21}$ cm$^{-3}$ of a group IIIB element such as gallium, aluminum, and boron; or of a group IB element such as copper may be contained to reduce the specific resistance, and the layer is then suitably used as an electrode. Examples of a method for forming the front transparent conductive layer include publicly known methods such as a sputtering method, an atmospheric pressure CVD method, a reduced pressure CVD method, an MOCVD method, an electron beam deposition method, a sol-gel method, an electrodeposition method, and a spraying method.

Further, a texture structure may be formed on a surface of the front transparent conductive layer. This is because the texture structure can refract and scatter light to produce an optical confinement effect in the first photoelectric conversion layer and the second photoelectric conversion layer, and improvement of the short circuit current density can be expected. The texture structure can be formed by giving dry etching, wet etching, or the like on the surface of the transparent substrate and the surface of the front transparent conductive layer. In the dry etching, the texture structure is formed by physically or chemically performing etching by applying an etching gas ionized or radicalized by plasma discharge. As for the etching gas, an inert gas such as Ar is used for the physical etching; and $CF_4$, $SF_6$, and the like are used as a fluorine gas, and $CCl_4$, $SiCl_4$, and the like are used as a chlorine gas for the chemical etching. Examples of the wet etching method usable here include a method in which the transparent substrate or the front transparent conductive layer is immersed in an acid or alkaline solution. As the acid solution usable here, may be mentioned hydrochloric acid, sulfuric acid, nitric acid, hydrofluoric acid, acetic acid, formic acid, perchloric acid, and the like, which may be used independently or in combination of two or more kinds thereof. As the alkaline solution, may be mentioned sodium hydroxide, ammonia, potassium hydroxide, calcium hydroxide, aluminum hydroxide, and the like, which may be used independently or in combination of two or more kinds thereof. In addition, the texture structure may be formed by performing mechanical processing such as sandblast. Instead of the use of the above-described etching methods, furthermore, may be mentioned a method of using a surface texture structure formed by crystal growth of a material for a transparent conductive film during deposition of a transparent conductive film by a CVD method or the like, a method of using a regular surface texture structure formed because a plane of crystal growth is oriented, a method of using formation of a texture structure depending on a crystal grain size at the time of the transparent conductive film formation by a sol-gel method and a spraying method.

1-3. First Photoelectric Conversion Layer

The first photoelectric conversion layer is a silicon-based photoelectric conversion layer, formed in a p-i-n structure having a p-type silicon-based semiconductor layer, an intrinsic (i-type) silicon-based semiconductor layer and an n-type silicon-based semiconductor layer. In addition, the intrinsic semiconductor layer may be one exhibiting a weak p-type or n-type conductive type, as long as it does not damage a photoelectric conversion function. The silicon-based semiconductor layer refers to a layer formed of a silicon semiconductor; or a silicon semiconductor containing carbon, germanium, or other impurities added thereto. In addition, the silicon-based photoelectric conversion layer refers to a photoelectric conversion layer in which all the three semiconductor layers constituting the p-i-n structure are silicon-based semiconductor layers. As methods for producing such a layer, CVD methods are common. The CVD methods include an atmospheric pressure CVD method, a reduced pressure CVD method, a plasma CVD method, a thermal CVD method, a hot-wire CVD method, an MOCVD method, and the like.

Here, a p-i-n structure in which a hydrogenated amorphous silicon (bandgap: 1.7 eV or more) is used as a semiconductor material for forming the first photoelectric conversion layer will be described for example. The first photoelectric conversion layer was formed to comprise a p-type silicon-based semiconductor layer, an i-type silicon-based semiconductor layer, and an n-type silicon-based semiconductor layer deposited in order of p-i-n from the light entrance side. The p-type silicon-based semiconductor layer is one formed by doping a hydrogenated amorphous silicon semiconductor with impurity atoms to provide p-type conductivity such as boron and aluminum. The i-type silicon-based semiconductor layer is a hydrogenated amorphous silicon semiconductor to which impurities are not particularly added. However, as long as it is a substantially intrinsic semiconductor, it may contain a small amount of impurity atoms. The n-type silicon-based semiconductor layer is one formed by doping the above-described semiconductor layer with impurity atoms to provide n-type conductivity such as phosphorus and nitrogen. Here, for each semiconductor layer described above, silicon alloys in which a bandgap is modified by adding an element such as carbon and germanium may be appropriately used. In addition, the p-type silicon-based semiconductor layer and the i-type silicon-based semiconductor layer desirably have a buffer layer of an i-type silicon-based semiconductor layer formed therebetween.

Furthermore, the film thickness of the i-type silicon-based semiconductor layer (optically active layer) is not particularly limited, but it is desired to be approximately 100 nm to 500 nm from viewpoints of prevention of damage to a photoelectric conversion function, prevention of a photodegradation phenomenon, and reduction of production costs. Since the p-type silicon-based semiconductor layer and the n-type silicon-based semiconductor layer are not optically active layers, the film thickness thereof is preferably thin to an extent that a photoelectric conversion function is not damaged. Accordingly, the film thickness thereof is not particularly limited but is desirably 100 nm or less.

1-4. Interlayer

As the interlayer, a silicon nitride is formed on the first photoelectric conversion layer. Here, the silicon nitride refers to those mainly containing a nitrogen atom and a silicon atom, including not only ones having a stoichiometry ratio of $Si_3N_4$ but also hydrogenated amorphous silicons or hydrogenated polycrystalline (microcrystalline) silicons containing nitrogen atoms. The silicon nitride may be defined, for example, as those substantially formed of a nitrogen atom, a silicon atom, and a hydrogen atom, and may contain other atoms such as carbon. It is common that the interlayer of a silicon nitride is formed by a plasma CVD method, and a gas containing an Si atom and a gas containing an N atom are used. As the gas containing an Si atom, for example, an $SiH_4$ gas is used, and as the gas containing an N atom, for example, an $N_2$ gas or an $NH_3$ gas are used.

When the interlayer is formed by a plasma CVD method with the use of a material gas containing an $N_2$ gas and an $SiH_4$ gas, the gas flow rate ratio of $N_2/SiH_4$ is, for example, 10 to 1000, and specifically, 10, 25, 50, 75, 100, 125, 150, 175, 200, 225, 250, 275, 300, 350, 400, 450, 500, 600, 700, 800, 900, and 1000, for example. The gas flow rate ratio of $N_2/SiH_4$ may be in a range between any two of the numeral values exemplified here.

The silicon nitride may have an index of refraction of approximately 1.6 to 3.6 by adjusting the nitrogen concentration in the film, and the value may be smaller than that of the silicon-based semiconductor layer constituting the first photoelectric conversion layer. For example, the index of refraction of the silicon nitride for light having a wavelength of 600 nm may be approximately 1.6 to 3.6, while the index of refraction of the silicon-based semiconductor layer constituting the first photoelectric conversion layer for light having a wavelength of 600 nm is approximately 4. By providing an interlayer having an index of refraction different from that of the first photoelectric conversion layer, reflection of light at the interface between the layers is increased to increase the amount of light reflected to the first photoelectric conversion layer, thereby increasing the photocurrent generated in the first photoelectric conversion layer.

The smaller the index of refraction of the silicon nitride interlayer is, the larger the amount of light reflected to the first photoelectric conversion layer is, which is desirable, and the index of refraction can be smaller as the nitrogen atom concentration in the silicon nitride is increased.

The nitrogen atom concentration in the interlayer is, for example, 2 to 60 atomic %, and specifically, 2, 5, 10, 15, 20, 25, 30, 35, 40, 45, 50, 55, and 60 atomic %, for example. The nitrogen atom concentration in the interlayer may be in a, range between any two of the numeral values exemplified here.

In addition, the smaller the light absorption coefficient of the silicon nitride interlayer is, the more desirable. This is because light that fails to be absorbed in the silicon nitride interlayer reaches the second photoelectric conversion layer and generates a photocurrent to be used effectively.

The interlayer has at least one aperture formed therein so that the first photoelectric conversion layer is exposed there. The aperture refers to an area where the first photoelectric conversion layer and the second photoelectric conversion layer having the interlayer therebetween contact with each other. More specifically, a case in which island-shaped apertures are scattered in an interlayer and a case in which island-shaped interlayers are formed between apertures are included. Further, an area where the first photoelectric conversion layer and the second photoelectric conversion layer contact with each other may be provided in, for example, one island of the island-shaped interlayers. Still further, when island-shaped interlayers are scattered on the first photoelectric conversion layer, and the first photoelectric conversion layer and the second photoelectric conversion layer contact with each other at the other area, the contacting area is an aperture.

In addition, the number, shape, size and arrangement of the aperture vary. Since the interlayer layer has at least one aperture, light that has reached the interlayer passes through the interlayer at high permeability. Therefore, the amount of incident light in the second photoelectric conversion layer increases. In addition, the amount of incident light in the second photoelectric conversion layer may be adjusted by adjusting the size or density of the aperture to be formed in the interlayer. Therefore, the aperture can be formed so that the short circuit current density of the first photoelectric conversion layer and that of the second photoelectric conversion layer are equal to obtain a stacked photoelectric conversion device of high efficiency. Here, the number of apertures may be one, or two or more, as long as the effect of the present invention can be obtained.

Usually, the first photoelectric conversion layer is formed of a material having a large bandgap, and in the first photoelectric conversion layer, therefore, more light of a shorter wavelength is absorbed while less light of a longer wavelength is absorbed. In this case, therefore, more light of a longer wavelength reaches the interlayer. When the interlayer does not have any aperture, most of the light of a longer wavelength was reflected and not used in photoelectric conversion. According to the present embodiment, however, the interlayer has an aperture, and the light of a longer wavelength therefore passes through the interlayer efficiently, contributing to photoelectric conversion in the second photoelectric conversion layer. Thus, according to the present embodiment, it is possible to enhance the photoelectric conversion efficiency. In particular, according to the present embodiment, it is possible to obtain a stacked photoelectric conversion device of high photoelectric conversion efficiency, because use efficiency of light of a longer wavelength can be improved as described above, and a higher current value can be achieved both in the first photoelectric conversion layer and the second photoelectric conversion layer by adjusting the size, density, or the like of the aperture. Since the effect of light reflection to the first photoelectric conversion layer is significant when the average film thickness of the interlayer is 5 nm or more, and light absorption in the interlayer increases as the average film thickness increases, the average film thickness is preferably 500 nm or less for purpose of prevention of the light absorption. More preferably, the average film thickness is 10 to 100 nm. The average film thickness referred to herein means an average film thickness of the interlayer in the part other than the aperture. In addition, the average film thickness can be measured by cross-sectional observation with an electron microscope, an optical microscope, an atomic force microscope, or the like.

Further, a texture structure may be provided to a surface of the interlayer. This is because an optical confinement effect such as light-scattering and refraction owing to the texture structure on the surface of the interlayer can improve values of optical currents generated both in the first and second photoelectric conversion layers, respectively, and therefore enhancement of the conversion efficiency of the stacked photoelectric conversion device can be expected. When a texture structure is formed on a front transparent conductive layer, the texture structure of the interlayer is formed by carrying over the texture structure on the front transparent conductive layer.

Characteristics desired for materials forming the interlayer are: to have an index of refraction different from that of the first photoelectric conversion layer and to have smaller light absorption coefficient at least in a wavelength range in which light can be absorbed in a photoelectric conversion layer located at a side opposite to a light entrance side with respect to the interlayer (the second photoelectric conversion layer). Since the interlayer has an aperture, and the first photoelectric conversion layer and the second photoelectric conversion layer are electrically connected with each other via the aperture in the present embodiment, the interlayer does not need to have electrical conductivity.

The aperture of the interlayer can be formed by a mask process, for example. Examples of the mask process include a method in which the interlayer is formed under masking with a metal mask; and a method in which a resist having an aperture is formed on the interlayer, and then dry etching, wet etching, or the like that is the same as for the formation of the texture structure on the surface of the front transparent conductive layer is performed. As the resist, a photoresist may be used, for example.

1-5. Aperture Percentage of Interlayer

The "aperture percentage of interlayer" may be determined, when cross-sectional observation of a stacked photoelectric conversion device is carried out with an optical microscope such as a laser microscope (for example, FIG. 1), from a proportion obtained by adding up all widths (lines) 14 of each aperture and, dividing it by a width (line) 15 of the stacked photoelectric conversion device. Here, for higher calculation accuracy of the aperture percentage, the observation is preferably carried out under such a condition that the width (line) 15 of the stacked photoelectric conversion device is 10 mm or more. In addition, it is preferable that surface observation is carried out in the same manner as described above for comparison with a result of the cross-sectional observation, because calculation accuracy for the widths (lines) 14 of each aperture is higher in this case.

When the aperture percentage of the interlayer is 0.5% or more, permeability of light of a longer wavelength in the interlayer improves significantly, and when the aperture percentage of the interlayer is 90% or less, a significant effect of reflection of light of a shorter wavelength to the first photoelectric conversion layer is obtained.

Therefore, the aperture percentage is preferably 0.5 to 90% in order to obtain a high short-circuit current density both in the first photoelectric conversion layer and the second photoelectric conversion layer. More preferably, the aperture percentage is 16 to 63%. For example, the aperture percentage is 0.5, 1, 5, 10, 15, 20, 25, 30, 35, 40, 45, 50, 55, 60, 65, 70, 75, 80, 85, and 90%. The aperture percentage may be in a range between any two of the numeral values exemplified here.

1-6. Interval Between Apertures of Interlayer

Since the interlayer is an insulating layer formed of a silicon nitride in the present invention, carriers generated in an upper part or a lower part of the interlayer move in either the p-type or the n-type silicon-based semiconductor layer contacting the interlayer in a surface direction thereof, and move to the other photoelectric conversion layer through an aperture of the interlayer. Therefore, carrier recombination due to non-bonding hands of the silicon-based semiconductor layer located in the vicinity of the interface between the interlayer and the silicon-based semiconductor layer is likely to occur during the move in the p-type or the n-type silicon-based semiconductor layer contacting the interlayer.

Therefore, in order to reduce the above-described carrier recombination, it is desirable to make a width (corresponding to a length represented by reference numeral 16 in FIG. 1) of the part where the interlayer and the p-type or the n-type silicon-based semiconductor layer contact with each other (hereinafter, referred to as "contacting part") smaller. Specifically, the width of the contacting part is desirably 1 mm or less, more desirably, 0.75 mm or less, still more desirably, 0.5 mm or less, and most desirably, 0.1 mm or less. For example, the width of the contacting part is 0.1, 0.2, 0.3, 0.4, 0.5, 0.6, 0.7, 0.8, 0.9, and 1 mm. The width of the contacting part may be in a range between any two of the numeral values exemplified here, or may be lower than any one thereof.

The "width of the contacting part" refers to a value of the widest part, and when there is a plurality of contacting parts, refers to the largest value of the "widths of the contacting parts".

The width of the contacting part can be measured by observing a cross-section and a surface of the stacked photoelectric conversion device with an optical microscope such as a laser microscope.

1-7. Second Photoelectric Conversion Layer

The second photoelectric conversion layer is formed on the interlayer. And, the first and second photoelectric conversion layers contact with each other via the aperture of the interlayer.

The structure, semiconductor materials, and production method of the second photoelectric conversion layer are the same as in the first photoelectric conversion layer, and basically, any of the above-mentioned may be used, but it is desirable that the bandgap of an optically active layer is smaller than that of the first photoelectric conversion layer. In addition, when considering combination of the first photoelectric conversion layer and the second photoelectric conversion layer, it is more desirable that, assuming optically active materials of respective layers are A and B, A/B is a combination of materials of the same system such as a-Si/a-Si, μc-Si/μc-Si, a-Si/a-SiGe, a-Si/c-Si, a-Si/μc-Si, because such a combination has advantages of close thermal expansion coefficients, similarity in production methods, and the like.

Here, a p-i-n structure in which a hydrogenated microcrystalline silicon (bandgap: 1.1 eV or less) is used as a semiconductor material for forming the second photoelectric conversion layer will be described for example. The hydrogenated microcrystalline silicon generically refers to thin films obtained by preparing a crystal silicon thin film at a low temperature using a non-equilibrium method such as a plasma CVD method, most of which have a smaller grain size (from several tens to thousand. A) and are in a state of a mixed phase with an amorphous silicon in this case.

The second photoelectric conversion layer is formed to comprise a p-type silicon-based semiconductor layer, an i-type silicon-based semiconductor layer, and an n-type silicon-based semiconductor layer deposited in order of p-i-n from the light entrance side. That is, the junction direction needs to be the same between the first photoelectric conversion layer and the second photoelectric conversion layer.

The p-type silicon-based semiconductor layer is one formed by doping a hydrogenated microcrystalline silicon semiconductor with impurity atoms to provide p-type conductivity such as boron and aluminum, and further containing a nitrogen atom. Since the interlayer of a silicon nitride is formed before the formation of the p-type silicon-based semiconductor layer in the present embodiment, nitrogen atoms on the surface of the silicon nitride interlayer are beaten out by plasma to allow the p-type silicon-based semiconductor layer being formed to contain a nitrogen atom.

The nitrogen atom concentration in the p-type silicon-based semiconductor layer may be adjusted by the following methods.

Firstly, may be mentioned a method in which the nitrogen atom concentration in the interlayer of a silicon nitride is adjusted by conditions for the film formation. While the interlayer of a silicon nitride is generally formed by a plasma CVD method as described above, the nitrogen atom concentration in the interlayer of a silicon nitride can be adjusted by adjusting the proportion of nitrogen atoms to silicon atoms contained in a gas used for the film formation by controlling the flow rate of gases containing each atom. Thereby, the number of nitrogen atoms to be beaten out by plasma can be adjusted at the time of the formation of the p-type silicon-based semiconductor layer to increase or decrease the number of nitrogen atoms to be taken into the p-type silicon-based semiconductor layer.

Secondly, may be mentioned a method in which the p-type silicon-based semiconductor layer is formed in the same film forming chamber used for formation of a silicon nitride. In terms of simplification of processes, it is desirable that the silicon nitride constitutes the interlayer. Since the silicon nitride is attached to a cathode electrode, an anode electrode, and other parts in the film forming chamber after the silicon nitride is formed, formation of the p-type silicon-based semiconductor layer in such a film forming chamber atmosphere allows the film to contain a nitrogen atom.

Thirdly, may be mentioned a method in which the nitrogen atom concentration in the p-type silicon-based semiconductor layer is adjusted by conditions for the film formation. While the p-type silicon-based semiconductor layer is generally formed by a plasma CVD method as described above, the nitrogen atom concentration in the p-type silicon-based semiconductor layer can be increased or decreased by adjusting the proportion of nitrogen atoms to silicon atoms contained in a gas used for the film formation by controlling the flow rate of gases containing each atom.

Here, whether or not nitrogen is contained in the p-type silicon-based semiconductor layer can be determined based on analysis from secondary ion mass spectrometry (SIMS). That is, when the p-type silicon-based semiconductor layer is considered to contain nitrogen, it means 0.001 atomic % or more of nitrogen atoms are detected in a part of the same detection depth as that of a p-type layer in which 0.001 atomic % or more of an impurity atom of a p-conductive type (for example, boron atom) is detected.

When formed by a plasma CVD method using a gas containing no nitrogen atom, the p-type silicon-based semiconductor layer has a nitrogen atom concentration of approximately $1.0 \times 10^{-5}$ atomic %, which does not reach 0.001 atomic %. That means, therefore, the p-type silicon-based semiconductor layer will have a nitrogen atom concentration of 0.001 atomic % or more, only when the p-type silicon-based semiconductor layer is formed by a method in which nitrogen atoms are intentionally included.

For example, the nitrogen atom concentration in the p-type silicon-based semiconductor layer is 0.001 to 10 atomic %, and specifically, 0.001, 0.005, 0.01, 0.05, 0.1, 0.2, 0.3, 0.4, 0.5, 0.6, 0.7, 0.8, 0.9, 1, 2, 3, 4, 5, 6, 7, 8, 9, and 10 atomic %, for example. The nitrogen atom concentration in the semiconductor layer may be in a range between any two of the numeral values exemplified here.

In addition, the "nitrogen atom concentration in the p-type silicon-based semiconductor layer" refers to the largest value of nitrogen atom concentrations in a part where an impurity atom of a p-conductive type of 0.001 atomic % or more is detected by the secondary ion mass spectrometry (SIMS).

The nitrogen atom concentration in the p-type silicon-based semiconductor layer is desirably distributed to gradually decrease from the interface between the p-type silicon-based semiconductor layer and the interlayer. Such a distribution of the nitrogen atom concentration allows continuous variation of the structure in the interface to form an interface of less strain and less stress, thereby achieving prevention of peel-off of a film and enhancement of the photoelectric conversion efficiency. The enhancement of the photoelectric conversion efficiency is considered to be owing to decrease of carrier recombination at the interface.

The effect owing to such a distribution of the nitrogen atom concentration is particularly beneficial when the p-type silicon-based semiconductor layer contains a crystalline silicon, that is, when the p-type silicon-based semiconductor layer is a so-called microcrystalline layer. When the p-type silicon-based semiconductor layer is a microcrystalline layer, the junction state at the interface with the interlayer of a silicon nitride having an amorphous structure may not be satisfactory. However, the junction state between the layers can be improved by increasing the nitrogen atom concentration in the p-type silicon-based semiconductor layer in the vicinity of the interface, because in this case, the proportion of an amorphous phase in the p-type silicon-based semiconductor layer is increased in the vicinity of the interface. And, the proportion of the amorphous phase included in the p-type silicon-based semiconductor layer can be gradually decreased as it is distant from the interface by gradually decreasing the nitrogen atom concentration in the p-type silicon-based semiconductor layer, thereby achieving more continuous variation of the structure.

In addition, the p-type silicon-based semiconductor layer is desirably a hydrogenated silicon layer. Generally, when two semiconductors are joined, the more similar material compositions of both the semiconductors to be joined are, the fewer defects (non-bonding hands) that occur at the interface between the semiconductors. Since the material composition of the p-type silicon-based semiconductor layer can be more similar to that of the interlayer by adopting a hydrogenated silicon layer containing a nitrogen atom as the p-type silicon-based semiconductor layer contacting the interlayer of a silicon nitride in the present embodiment, defects due to non-bonding hands at the interface between the layers are unlikely to occur, allowing reduction of carrier recombination.

The i-type silicon-based semiconductor layer is a hydrogenated microcrystalline silicon semiconductor to which impurities are not particularly added. However, as long as it is a substantially intrinsic semiconductor, it may contain a small amount of impurity atoms. The n-type silicon-based semiconductor layer is one formed by doping the above-described semiconductor layer with impurity atoms to provide n-type conductivity such as phosphorus, nitrogen, and oxygen. Here, for each semiconductor layer described above, silicon alloys in which the bandgap is modified by adding an element such as carbon and germanium may be appropriately used.

Furthermore, the film thickness of the i-type silicon-based semiconductor layer (optically active layer) is not particularly limited, but it is desired to be approximately 1 μm to 100 μm from viewpoints of prevention of damage to a photoelectric conversion function and reduction of production costs. Besides, the film thickness is desirably sufficient to generate a photocurrent that is equivalent to a photocurrent generated in the first photoelectric conversion layer. Since the p-type silicon-based semiconductor layer and the n-type silicon-based semiconductor layer are not optically active layers, the film thickness thereof is preferably thin to an extent that a photoelectric conversion function is not damaged. Therefore, the film thickness is desirably 100 nm or less, though not particularly limited.

1-8. Back Electrode Layer

The back electrode layer may have at least one conductive layer and preferably has a higher optical reflectance and a higher conductivity. The conductive layer may be formed of metal materials such as silver, aluminum, titanium, palladium, and the like, which have a high reflectance of visible light; or alloys thereof. The conductive layer may be formed by a CVD method, a sputtering method, a vacuum deposition method, an electron beam deposition method, a spraying method, a screen printing method, or the like. The conductive layer contributes to enhancement of the photoelectric conversion efficiency, because the layer reflects light that has not been absorbed in the photoelectric conversion layer to return it to the photoelectric conversion layer again.

The back electrode layer preferably includes a back transparent conductive layer and a conductive layer stacked in this order. In this case, there are obtained an effect of enhancing optical confinement and an effect of improving optical reflectance for incident light. In addition, the elements contained in the conductive layer can be prevented from diffusing to the photoelectric conversion layer. The back transparent conductive layer can be formed of a similar material and by a similar method as in the front transparent conductive layer described in the section of "1-2. Front transparent conductive layer".

2. Embodiment 2

Substrate Structure

A photoelectric conversion device according to Embodiment 2 of the present invention comprises: a plurality of silicon-based photoelectric conversion layers having a p-i-n structure, a transparent conductive layer, and a grid electrode stacked in this order on a metal substrate or a substrate having a surface coated with a metal, wherein at least a pair of adjacent photoelectric conversion layers have an interlayer of a silicon nitride therebetween, the interlayer has at least one aperture, and the pair of the photoelectric conversion layers (referred to as a first photoelectric conversion layer and a second photoelectric conversion layer from a side of the substrate, respectively) having the interlayer therebetween contact with each other via the aperture.

When attention is paid to the pair of silicon-based photoelectric conversion layers having the interlayer therebetween and having the p-i-n structure, in addition, the photoelectric conversion device of the present invention may be described as comprising: a first photoelectric conversion layer, an interlayer of a silicon nitride, a second photoelectric conversion layer, a transparent conductive layer, and a grid electrode stacked in this order on a metal substrate or a substrate having a surface coated with a metal, wherein the interlayer has at least one aperture, and the first and second photoelectric conversion layers contact with each other via the aperture.

In this case, a side of the grid electrode is a light incident surface.

2-1. Substrate

A substrate of a metal or the like such as stainless steel (SUS) and aluminum may be used for the substrate. In addition, a substrate of glass, a heat resistant polymeric film (polyimide, PET, PEN, PES, or Teflon (registered trademark), etc.), or ceramics coated with a metal may be used for the substrate. Or, these substrates may be laminated to be used for the substrate.

2-2. First and Second Photoelectric Conversion Layers

The structures, production methods, and the like of the first and second photoelectric conversion layers are the same as those described in Embodiment 1. In the present embodiment, however, the first photoelectric conversion layer is a bottom cell and the second photoelectric conversion layer is a top cell. Therefore, it is preferable that the bandgap of the second photoelectric conversion layer is larger than the bandgap of the first photoelectric conversion layer. In this case, light of a shorter wavelength can be absorbed mainly in the second photoelectric conversion layer, and light of a longer wavelength can be absorbed mainly in the first photoelectric conversion layer, thereby allowing efficient utilization of incident light. Specifically, for example, the second photoelectric conversion layer is formed of a hydrogenated amorphous silicon, and the first photoelectric conversion layer is formed of a hydrogenated microcrystalline.

In the present embodiment, the first photoelectric conversion layer is formed on the substrate in order of n-type, i-type, and p-type; the interlayer is formed thereon; and then the second photoelectric conversion layer is formed in order of n-type, i-type, and p-type. Therefore, a p-type silicon-based semiconductor layer containing nitrogen is a p-type layer of the first photoelectric conversion layer.

As a method for allowing the p-type silicon-based semiconductor layer to contain a nitrogen atom in the present embodiment, may be mentioned (1) a method in which the nitrogen atom concentration in the interlayer is increased, (2) a method in which a gas containing a nitrogen atom is included in a material gas to be used for formation of the p-type silicon-based semiconductor layer, a combination of these methods, and the like.

2-3. Interlayer

The structure, production method, and the like of the interlayer are the same as those described in Embodiment 1.

2-4. Transparent Conductive Layer

The structure, production method, and the like of the transparent conductive layer are the same as those described in the section of "1-2. Front transparent conductive layer".

2-5. Grid Electrode

Preferably, the grid electrode is formed on the transparent conductive layer. A commonly known structure, production method, and the like may be used for the grid electrode.

3. Other Embodiments

As described above, it is preferable that one of the first and second photoelectric conversion layers (the pair of photoelectric conversion layers having the interlayer therebetween) has a bandgap larger than that of the other. This is because incident light can be used efficiently by making the bandgap of the photoelectric conversion layer of the top cell larger than the bandgap of the bottom cell. In addition, it is preferable that one of the first and second photoelectric conversion layers (the pair of photoelectric conversion layers having the interlayer therebetween) is formed of a hydrogenated amorphous silicon, and the other is formed of a hydrogenated microcrystalline silicon. In this case, the bandgap of one photoelectric conversion layer is larger than the bandgap of the other photoelectric conversion layer.

And, a stacked photoelectric conversion device having three or more photoelectric conversion layers and being provided with an interlayer of a silicon nitride between any two of the photoelectric conversion layers can be produced. As an example of the embodiment, may be mentioned a structure of hydrogenated amorphous silicon/hydrogenated amorphous silicon/silicon nitride interlayer/hydrogenated microcrystalline silicon from the light entrance side.

EXAMPLES

Hereinafter, examples of the present invention will be described.

In the present examples, a stacked photoelectric conversion device of a superstraight type, comprising a photoelectric conversion layer having a hydrogenated amorphous silicon/a photoelectric conversion layer having a hydrogenated microcrystalline silicon will be described, for example.

1. Examples 1 to 4

1-1. Configuration of Stacked Photoelectric Conversion Device

Figure 2:
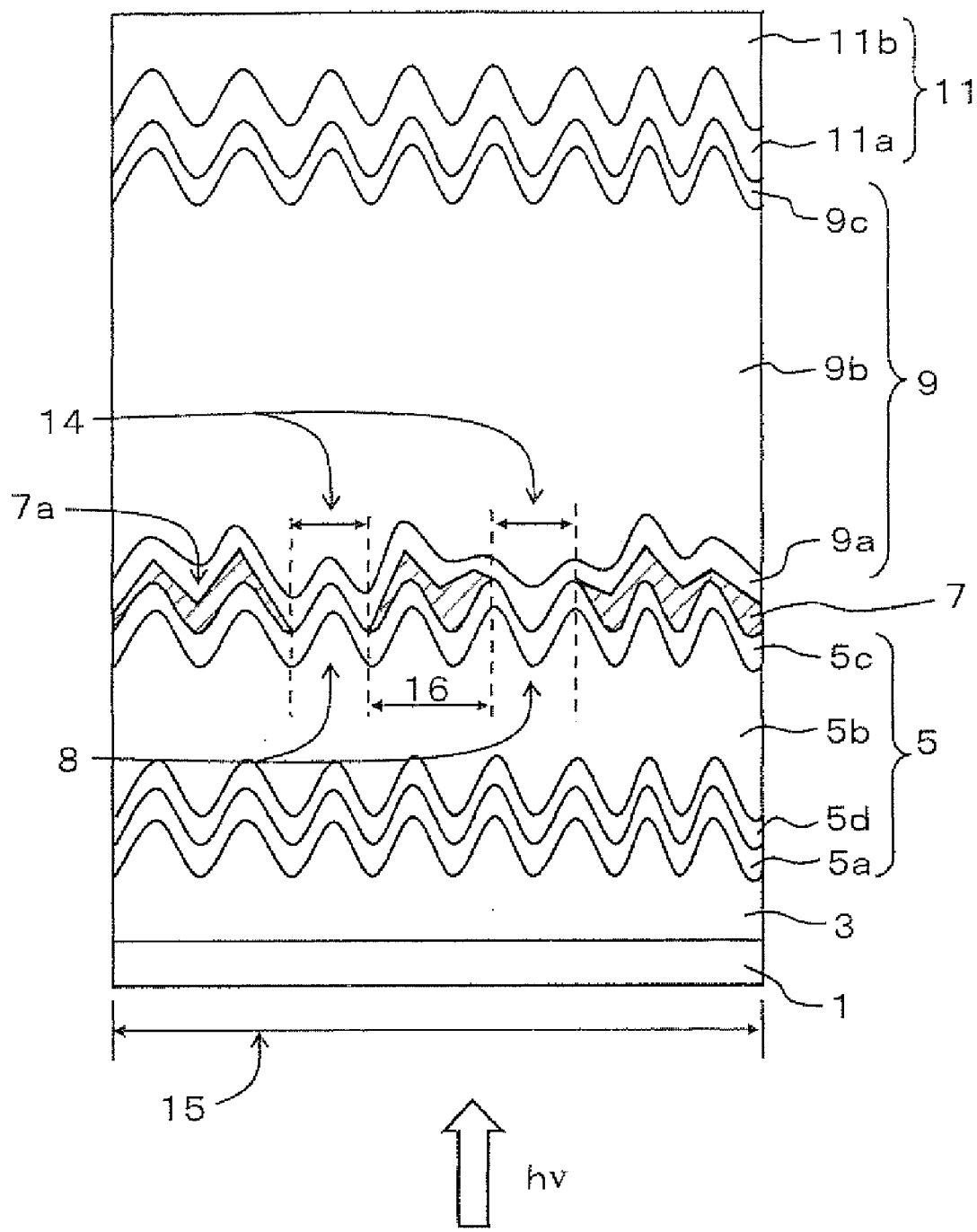
FIG. 2 is a sectional view illustrating a configuration of a stacked photoelectric conversion device according to Embodiments 1 to 14 of the present invention.

FIG. 2 is a sectional view illustrating a configuration of a stacked photoelectric conversion device according to Examples 1 to 4. The stacked photoelectric conversion device of these Examples comprises a front transparent conductive layer 3, a first photoelectric conversion layer 5, an interlayer 7, a second photoelectric conversion layer 9, and a back electrode layer 11 stacked in this order on a transparent substrate 1. The interlayer 7 has a plurality of apertures 8, and the first and second photoelectric conversion layers 5, 9 contact with each other via the apertures 8. In addition, the first photoelectric conversion layer 5 comprises a p-type silicon-based semiconductor layer 5a, a buffer layer 5d, an i-type silicon-based semiconductor layer 5b, and an n-type silicon-based semiconductor layer 5c stacked in this order, and the second photoelectric conversion layer 9 comprises a p-type silicon-based semiconductor layer 9a, an i-type silicon-based semiconductor layer 9b, and an n-type silicon-based semiconductor layer 9c stacked in this order. The back electrode layer 11 comprises a back transparent conductive layer 11a and a conductive layer 11b stacked in this order.

1-2. Method for Producing Stacked Photoelectric Conversion Device

The stacked photoelectric conversion device was produced as follows.

First, with the use of a glass substrate having a flat surface as the transparent substrate 1, a zinc oxide layer was formed as the front transparent conductive layer 3 so as to have a thickness of 500 nm by a magnetron sputtering method at a substrate temperature of 200° C. Successively, etching was performed onto a surface of the front transparent conductive layer 3. After having immersed in 0.5% aqueous hydrochloric acid of a solution temperature at 25° C. for 90 seconds, the surface of the front transparent conductive layer 3 was washed with purified water sufficiently. With regard to the front transparent conductive layer 3 after the etching, the sheet resistor was 15 Ω/square, the film thickness was 380 nm, the permeability for light having a wavelength of 550 nm was 80%, and the haze factor was 45%.

On the obtained substrate, the first photoelectric conversion layer 5, the interlayer 7, and the second photoelectric conversion layer 9 were formed by a plasma CVD method. The plasma CVD apparatus used in the present examples is in a size with the inside of a film forming chamber of 1 m×1 m×50 cm.

First, a p-type amorphous silicon carbide was formed as the p-type silicon-based semiconductor layer 5a. The p-type silicon-based semiconductor layer 5a was formed under conditions of a substrate temperature of 200° C., an internal pressure of the film forming chamber of the plasma CVD of 500 Pa, a power density per unit area of the cathode electrode of 0.05 W/cm$^2$, a mixture gas to be introduced into the film forming chamber composed of an SiH$_4$ gas/a B$_2$H$_6$ gas (diluted with hydrogen so as to have a concentration of 0.1%)/a CH$_4$ gas of 150 sccm/80 sccm/150 sccm, respectively, and a flow rate ratio of an H$_2$ gas to an SiH$_4$ gas of 20, and the film thickness of the layer was adjusted to 15 nm.

Next, an i-type amorphous silicon carbide was formed as the buffer layer 5d on the p-type silicon-based semiconductor layer 5a. Formation of a film was started under conditions of a substrate temperature of 200° C., an internal pressure of the film forming chamber of the plasma CVD of 500 Pa, a power density per unit area of the cathode electrode of 0.05 W/cm$^2$, a mixture gas to be introduced into the film forming chamber composed of an SiH$_4$ gas/a CH$_4$ gas of 150 sccm/150 sccm, respectively, and a flow rate ratio of an H$_2$ gas to an SiH$_4$ gas of 10, and the buffer layer 5d was formed while controlling the gas flow rate in such a way that a CH$_4$ gas flow rate decreases gradually from 150 sccm to 0 sccm to adjust the film thickness of the layer to 10 nm. Here, the CH$_4$ gas flow rate may be controlled so as to decrease gradually, or so as to decrease stepwise. It is desirable to control the CH$_4$ gas flow rate so as to decrease gradually or stepwise, because by such a control, discontinuity of a band profile at an interface between the p-type amorphous silicon carbide as the p-type silicon-based semiconductor layer 5a and an i-type amorphous silicon layer as the i-type silicon-based semiconductor layer 5b can be mitigated.

Next, the i-type amorphous silicon layer was formed as the i-type silicon-based semiconductor layer 5b on the buffer layer 5d. The i-type silicon-based semiconductor layer 5b was formed under conditions of a substrate temperature of 200° C., an internal pressure of the film forming chamber of the plasma CVD of 500 Pa, a power density per unit area of the cathode electrode of 0.07 W/cm$^2$, a mixture gas to be introduced into the film forming chamber composed of an SiH$_4$ gas of 300 seem, and a flow rate ratio of an H$_2$ gas to an SiH$_4$ gas of 20, and the film thickness of the layer was adjusted to 300 nm.

Next, an amorphous silicon layer was formed as the n-type silicon-based semiconductor layer 5c on the i-type silicon-based semiconductor layer 5b. The n-type silicon-based semiconductor layer 5c was formed under conditions of a substrate temperature of 200° C., an internal pressure of the film forming chamber of the plasma CVD of 500 Pa, a power density per unit area of the cathode electrode of 0.05 W/cm$^2$, a mixture gas to be introduced into the film forming chamber composed of an SiH$_4$ gas/a PH$_3$ gas (diluted with hydrogen so as to have a concentration of 1%) of 150 seem/30 seem, respectively, and a flow rate ratio of an H$_2$ gas to an SiH$_4$ gas of 5, and the film thickness of the layer was adjusted to 25 nm.

Thereby, the first photoelectric conversion layer 5 was formed.

The first photoelectric conversion layer 5 was masked with a stainless steel mask having a plurality of apertures, and then a silicon nitride layer was formed as the interlayer 7 so as to have a thickness of 100 nm by a plasma CVD method with the use of a mixture gas of SiH$_4$, H$_2$, and N$_2$ as a material gas under conditions of a flow rate of N$_2$ of 4.5 SLM, a flow rate of SiH$_4$ of 30 scum, a film-forming pressure of 1000 Pa, and a substrate temperature of 150° C. The film formation conditions allow formation of a silicon nitride interlayer having a nitrogen atom concentration of 20 atomic %. The nitrogen atom concentration in the interlayer 7 was measured by secondary ion mass spectrometry (SIMS). As the stainless steel mask, one having circular apertures of 50% in aperture percentage and of 1.25 mm, 1.0 mm, 0.75 mm, and 0.5 mm in diameter was used. Thereafter, the stainless steel mask was removed. In order to examine a shape of a surface of the interlayer 7 obtained in this way in detail, the shape of the surface was observed with an optical microscope. As a result, it was confirmed that the interlayer 7 was scattered on the n-type silicon-based semiconductor layer 5c in a shape almost the same as a part corresponding to the circular apertures of the stainless steel mask. That is, a part that is not covered with the interlayer 7 on the n-type silicon-based semiconductor layer 5c is an aperture of the present invention.

After the removal of the stainless steel mask following the formation of the interlayer 7, a substrate was disposed between another cathode electrode and another anode electrode in the film forming chamber used for the formation of the interlayer 7, and the p-type silicon-based semiconductor layer 9a of a p-type microcrystalline silicon layer was formed by a plasma CVD method. The p-type silicon-based semiconductor layer 9a was formed under conditions of a substrate temperature of 200° C., an internal pressure of the film forming chamber of the plasma CVD of 1000 Pa, a power density per unit area of the cathode electrode of 0.15 W/cm$^2$, a mixture gas to be introduced into the film forming chamber composed of an SiH$_4$ gas/a B$_2$H$_6$ gas (diluted with hydrogen so as to have a concentration of 0.1%) of 150 sccm/30 seem, respectively, and a flow rate ratio of an H$_2$ gas to an SiH$_4$ gas of 150, and the film thickness of the layer was adjusted to 40 nm. Though no silicon nitride is attached to the cathode electrode and the anode electrode for forming the p-type microcrystalline silicon layer, nitrogen atoms can be taken into the layer by forming the p-type microcrystalline silicon layer in the same film forming chamber, because the silicon nitride is attached to an inner wall or the like of the film forming chamber.

Next, an i-type microcrystalline silicon layer was formed as the i-type silicon-based semiconductor layer 9b on the p-type silicon-based semiconductor layer 9a. The i-type silicon-based semiconductor layer 9b was formed under conditions of a substrate temperature of 200° C., an internal pressure of the film forming chamber of the plasma CVD of 2000 Pa, a power density per unit area of the cathode electrode of 0.15 W/cm$^2$, a mixture gas to be introduced into the film forming chamber composed of an SiH$_4$ gas of 250 seem, and a flow rate ratio of an H$_2$ gas to an SiH$_4$ gas of 100, and the film thickness of the layer was adjusted to 2.5 μm.

Next, an n-type microcrystalline silicon layer was formed as the n-type silicon-based semiconductor layer 9c on the i-type silicon-based semiconductor layer 9b. The n-type silicon-based semiconductor layer 9c was formed under conditions of a substrate temperature of 200° C., an internal pressure of the film forming chamber of the plasma CVD of 2000 Pa, a power density per unit area of the cathode electrode of 0.15 W/cm$^2$, a mixture gas to be introduced into the film forming chamber composed of an SiH$_4$ gas/a PH$_3$ gas (diluted with hydrogen so as to have a concentration of 1%) of 150 sccm/30 sccm, respectively, and a flow rate ratio of an H$_2$ gas to an SiH$_4$ gas of 150, and the film thickness of the layer was adjusted to 40 nm.

Two layers of a zinc oxide layer having a thickness of 50 nm as the back transparent conductive layer 11a and a silver layer having a thickness of 500 nm as the conductive layer 11b were combined on the second photoelectric conversion layer 9 by a magnetron sputtering method to form the back electrode layer 11 to produce a stacked photoelectric conversion device in which light enters from a side of the substrate 1.

2. Comparative Example 1

Figure 3:
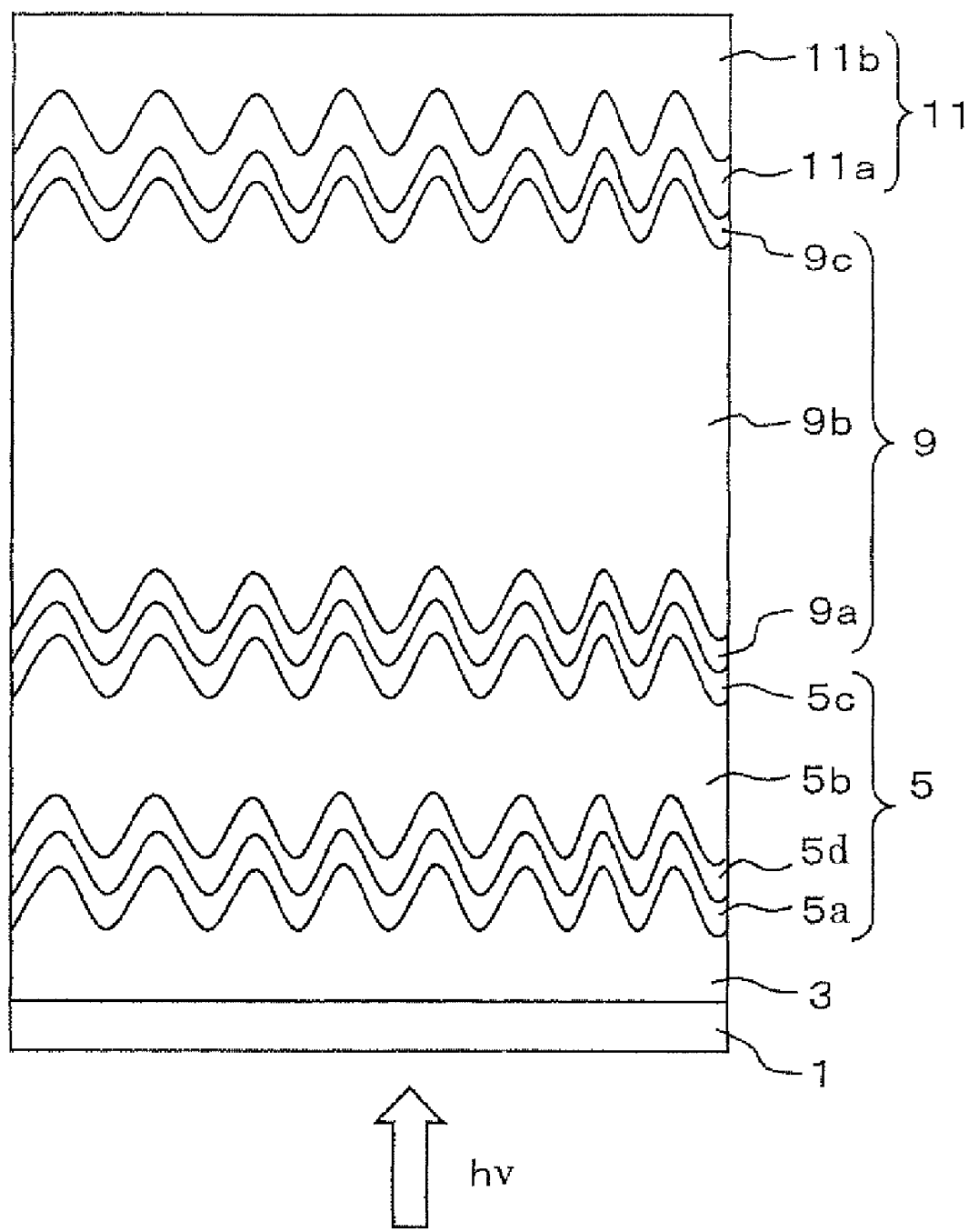
FIG. 3 is a sectional view illustrating a configuration of a stacked photoelectric conversion device according to Comparative Example 1.

FIG. 3 is a sectional view illustrating a configuration of a stacked photoelectric conversion device according to Comparative Example 1. While the interlayer 7 is provided partially in Examples 1 to 4, no interlayer is provided in Comparative Example 1. Other than that, the configuration is the same as that of Examples 1 to 4.

After completion of the formation up to the first photoelectric conversion layer 5 in the same manner as in Examples 1 to 4, the second photoelectric conversion layer 9 and the back electrode layer 11 were produced on the first photoelectric conversion layer 5 in the same manner as in Examples 1 to 4 to produce a stacked photoelectric conversion device in which light enters from a side of the substrate 1.

Table 1 shows a result of the stacked photoelectric conversion devices having a light-receiving area of 1 cm$^2$ obtained according to above-described Examples 1 to 4 and Comparative Example 1 measured for a current-voltage characteristic after irradiation of light of AM 1.5 (100 mW/cm$^2$) at 25° C. for 1000 hours.

The measurement result of Examples 1 to 4 reveals that more satisfactory characteristics are obtained when the apertures of the metal mask is 1 mm or less. That is, when the width of the part where the p-type or n-type silicon-based semiconductor layer contacts the interlayer 7 is 1 mm or less, it is possible to lessen influence on the conversion efficiency of the photoelectric conversion device given by the problem of carrier recombination caused by non-bonding hands of the silicon-based semiconductor layer located in the vicinity of the interface between the interlayer and the silicon-based semiconductor layer while the carriers move in the p-type or n-type silicon-based semiconductor layer contacting the interlayer 7. Furthermore, the width of the part where the p-type or n-type silicon-based semiconductor layer contacts the interlayer 7 is preferably 0.75 mm or less, and more preferably 0.5 mm or less.

In addition, comparison of the measurement result between Comparative Example 1 and Examples 2 to 4 reveals that the photoelectric conversion efficiency enhanced improved by inserting the interlayer 7.

TABLE 1

| | Diameter of apertures of mask (mm) | Photoelectric conversion efficiency (%) |
| --- | --- | --- |
| Example 1 | 1.25 | 11.0 |
| Example 2 | 1.0 | 11.3 |
| Example 3 | 0.75 | 11.6 |
| Example 4 | 0.5 | 11.7 |
| Comparative Example 1 | No interlayer | 10.9 |

3. Examples 5 to 8

In methods for producing stacked photoelectric conversion devices according to Examples 5 to 8, the nitrogen concentration in the p-type microcrystalline silicon layer of Example 2 is increased or decreased, and the nitrogen concentration can be adjusted by the following methods.

Firstly, may be mentioned a method in which the nitrogen atom concentration in the interlayer of a silicon nitride is increased or decreased by conditions for the film formation. While the interlayer of a silicon nitride is generally formed by a plasma CVD method as described above, the nitrogen atom concentration in the interlayer of a silicon nitride can be increased or decreased by adjusting the proportion of nitrogen atoms to silicon atoms contained in a gas used for the film formation by controlling the flow rate of gases containing each atom. Thereby, the number of nitrogen atoms to be beaten out from the interlayer by plasma at the time of the formation of the p-type microcrystalline silicon layer can be increased or decreased.

Secondly, may be mentioned a method in which the p-type microcrystalline silicon layer is formed in the same film forming chamber used for formation of a silicon nitride, and it is desirable that the silicon nitride constitutes the interlayer in terms of simplification of processes. Since the silicon nitride is attached to a cathode electrode, an anode electrode, and other parts in the film, forming chamber after the silicon nitride is formed, formation of the p-type microcrystalline silicon layer in such a film forming chamber atmosphere allows the film to contain a nitrogen atom.

Thirdly, may be mentioned a method in which the nitrogen atom concentration in the p-type microcrystalline silicon layer is adjusted by conditions for the film formation. While the p-type microcrystalline silicon layer is generally formed by a plasma CVD method as described above, the nitrogen atom concentration in the p-type microcrystalline silicon layer can be increased or decreased by adjusting the proportion of nitrogen atoms to silicon atoms contained in a gas used for the film formation by controlling the flow rate of gases containing each atom.

Hereinafter, methods for forming the interlayer 7 and the p-type microcrystalline silicon layer according to Example 5 will be described.

Formation conditions for the interlayer 7 are a flow rate ratio of N$_2$/SiH$_4$ of 150, a film-forming pressure of 1000 Pa, and a substrate temperature of 150° C. The film formation conditions allow formation of a silicon nitride interlayer having a nitrogen concentration of 20 atomic %.

Formation conditions for the p-type microcrystalline silicon layer are similar to those in Example 2, but different in that the p-type microcrystalline silicon layer was formed with the use of the cathode electrode and the anode electrode after the formation of the interlayer 7. That is, since a silicon nitride film is attached to the cathode electrode and the anode electrode before the formation of the p-type microcrystalline silicon layer, and plasma is generated between the electrodes to form the p-type microcrystalline silicon layer, nitrogen atoms beaten out from the electrodes by electrons or ions in the plasma will be taken into the p-type microcrystalline silicon layer.

This method allowed production of a stacked photoelectric conversion device having 0.05 atomic % of a maximum concentration of nitrogen contained in the p-type microcrystalline silicon layer.

Next, methods for forming the interlayer 7 and the p-type microcrystalline silicon layer according to Example 6 will be described.

Formation conditions for the interlayer 7 are a flow rate ratio of $N_2/SiH_4$ of 225, a film-forming pressure of 1000 Pa, and a substrate temperature of 150° C. The film formation conditions allow formation of a silicon nitride interlayer having a nitrogen concentration of 30 atomic %. Here, the flow rate ratio of $N_2/SiH_4$ was set by keeping a flow rate of the $SiH_4$ gas at a constant level of 30 sccm and varying a flow rate of the $N_2$ gas. This point is, true for the following Examples.

In addition, formation conditions for the p-type microcrystalline silicon layer are the same as in Example 5.

This method allowed production of a stacked photoelectric conversion device having 0.5 atomic % of a maximum concentration of nitrogen contained in the p-type microcrystalline silicon layer.

Next, methods for forming the interlayer 7 and the p-type microcrystalline silicon layer according to Example 7 will be described.

Formation conditions for the interlayer 7 are a flow ratio of $N_2/SiH_4$ of 300, a film-forming pressure of 1000 Pa, and a substrate temperature of 150° C. The film formation conditions allow formation of a silicon nitride interlayer having a nitrogen concentration of 40 atomic %.

In addition, formation conditions for the p-type microcrystalline silicon layer are the same as in Example 5.

This method allowed production of a stacked photoelectric conversion device having 5.0 atomic % of a maximum concentration of nitrogen contained in the p-type microcrystalline silicon layer.

Next, methods for forming the interlayer 7 and the p-type microcrystalline silicon layer according to Example 8 will be described.

Formation conditions for the interlayer 7 are the same as in Example 7.

As a condition for forming the p-type microcrystalline silicon layer in addition to the conditions in Example 7, an $N_2$ gas was mixed with a mixture gas used for the formation of the p-type microcrystalline silicon layer so that a flow rate ratio of $N_2/SiH_4$ would be 2.

This method allowed production of a stacked photoelectric conversion device having 10 atomic % of a maximum concentration of nitrogen contained in the p-type microcrystalline silicon layer.

Table 2 shows a result of the stacked photoelectric conversion devices having a light-receiving area of 1 cm² obtained according to Example 2, Examples 5 to 8, and Comparative Example 1 measured for a current-voltage characteristic after irradiation of light of AM 1.5 (100 mW/cm²) at 25° C. for 1000 hours.

In Table 2, comparison between Comparative Example 1 and Examples 5 to 8 reveals that more satisfactory photoelectric conversion characteristics are obtained by increasing the nitrogen concentration in the p-type microcrystalline silicon layer. That is, it is desirable that the nitrogen concentration in the p-type microcrystalline silicon layer is 0.001 to 10 atomic %. While a p-type microcrystalline silicon layer was used as the p layer in Examples 5 to 8, similar results can be obtained even in other p-type silicon-based semiconductor layers.

TABLE 2

| | N concentration in p layer (atomic %) | Photoelectric conversion efficiency (%) | Remarks |
|---|---|---|---|
| Comparative Example 1 | $10^{-5}$ | 10.9 | No silicon nitride interlayer |
| Example 2 | 0.001 | 11.3 | Interlayer (N concentration: 20 atomic %) |
| Example 5 | 0.05 | 11.6 | Interlayer (N concentration: 20 atomic %) |
| Example 6 | 0.5 | 12.3 | Interlayer (N concentration: 30 atomic %, $N_2/SiH_4$ flow rate ratio: 225) |
| Example 7 | 5 | 11.9 | Interlayer (N concentration: 40 atomic %, $N_2/SiH_4$ flow rate ratio: 300) |
| Example 8 | 10 | 11.3 | Interlayer (N concentration: 40 atomic %, $N_2/SiH_4$ flow rate ratio: 300, $N_2/SiH_4$ at p layer formation: 2) |

4. Examples 9 to 14

The method for producing a stacked photoelectric conversion device according Examples 9 to 14 is similar to that in Example 8. The method is different from. Example 8 in that an $N_2$ gas was mixed with the mixture gas for the formation of the p-type microcrystalline silicon layer so that the flow rate ratio of $N_2/SiH_4$ was 0.5, and that the nitrogen concentration in the interlayer 7 was varied from 10 to 60 atomic % by varying the flow rate ratio of $N_2/SiH_4$ at the time of the formation of the interlayer 7 from 75 to 1000. The pressure and the substrate temperature for the formation of the interlayer 7 were common, that is, 1000 Pa and 150° C.

Table 3 shows a result of the stacked photoelectric conversion devices having a light-receiving area of 1 cm² obtained according to Examples 9 to 14 measured for a current-voltage characteristic after irradiation of light of AM 1.5 (100 mW/cm²) at 25° C. for 1000 hours.

Table 3 reveals that the nitrogen concentration in the interlayer 7 no longer increases when the flow rate ratio of $N_2/SiH_4$ is more than 500. Therefore, the flow rate ratio of $N_2/SiH_4$ is preferably 500 or less.

Table 4 shows the relationship between the measured values of the flow rate ratio of $N_2/SiH_4$ and the index of refraction of interlayer 7 at the time of the formation of the interlayer 7. Shown in Table 4 are values of the index of refraction measured with a spectral ellipsometry device with, respect to light having a wavelength of 600 nm.

Table 4 reveals that it is possible to obtain a small index of refraction of approximately 1.6 to 1.7 by increasing the nitrogen concentration in the interlayer 7 by increasing the flow rate ratio of $N_2/SiH_4$, and that the flow rate ratio of $N_2/SiH_4$ is preferably 10 or more. The larger the difference between the index of refraction of interlayer 7 and the index of refraction of the silicon-based semiconductor layer (approximately 4) are, the more preferable. That is, the larger the difference between the index of refraction of the interlayer 7 and the index of refraction of the n-type silicon-based semiconductor layer 5c is, the larger the optical reflectance at the interface therebetween is, and the smaller the area for forming a film of the interlayer 7 can be. This is because the silicon nitride layer hardly has electrical conductivity, and therefore the smaller the area for forming a film of the interlayer 7 is and the more the parts in which the photoelectric conversion layers having the interlayer 7 therebetween directly contact with each other are, the more preferable in terms of reduction of the series resistance of the photoelectric conversion device.

Therefore, the flow rate ratio of $N_2/SiH_4$ is desirably in a range of 10 to 500.

In addition, secondary ion mass spectroscopy (SIMS) was performed on samples of Example 12 to reveal that the nitrogen atom concentration in the p-type microcrystalline silicon layer was distributed in such a way as to gradually decrease from the interface between the p-type microcrystalline silicon layer and the interlayer 7. Such distribution of the nitrogen atom concentration allows continuous variation of the structure in the interface to form an interface of less strain and less stress, thereby achieving prevention of peel-off of a film and enhancement of the photoelectric conversion efficiency. The enhancement of the photoelectric conversion efficiency is considered to be owing to decrease of carrier recombination at the interface.

Since the p-type silicon-based semiconductor layer is a microcrystalline layer in the present example, a particularly significant effect can be produced as a result of the gradual change of the nitrogen atom concentration as described in the section of "1-7. Second photoelectric conversion layer".

TABLE 3

|  | N concentration in interlayer (atomic %) | Photoelectric conversion efficiency (%) | $N_2/SiH_4$ flow rate ratio for interlayer formation |
| --- | --- | --- | --- |
| Example 9 | 10 | 11.6 | 75 |
| Example 10 | 20 | 12.0 | 150 |
| Example 11 | 30 | 12.4 | 225 |
| Example 12 | 40 | 12.6 | 300 |
| Example 13 | 60 | 12.5 | 500 |
| Example 14 | 60 | 12.6 | 1000 |

TABLE 4

| $N_2/SiH_4$ flow rate ratio | Index of refraction (wavelength: 600 nm) |
| --- | --- |
| 2.0 | 3.6 |
| 5.0 | 2.3 |
| 10.0 | 1.6 |
| 500 | 1.7 |

5. Example 15 and Comparative Example 2

A stacked photoelectric conversion device according to the present Example has three photoelectric conversion layers, and comprises a configuration including a third photoelectric conversion layer having, from a light entrance side, a first photoelectric conversion layer having an i-type hydrogenated amorphous silicon/a second photoelectric conversion layer having an i-type hydrogenated amorphous silicon/a silicon nitride interlayer/an i-type hydrogenated microcrystalline silicon.

In this configuration, the part of the second photoelectric conversion layer/the silicon nitride interlayer/the third photoelectric conversion layer was formed in the same manner as in Example 12, and the part of the first photoelectric conversion layer was formed in the same manner as in the second photoelectric conversion layer.

Table 5 shows a result of the stacked photoelectric conversion device according to Example 15 having a light-receiving area of 1 cm2, and the stacked photoelectric conversion device according to Comparative Example 2 having a light-receiving area of 1 cm2 and having a configuration in which the silicon nitride interlayer is omitted from the configuration of Example 15, measured for a current-voltage characteristic after irradiation of light of AM 1.5 (100 mW/cm2) at 25° C. for 1000 hours.

Table 5 confirmed that the conversion efficiency could be improved also in the stacked photoelectric conversion device having three photoelectric conversion layers according to the present example by adopting a configuration in which a silicon nitride interlayer is partially provided between the second photoelectric conversion layer and the third photoelectric conversion layer.

TABLE 5

|  | N concentration in interlayer (atomic %) | Photoelectric conversion efficiency (%) | Remarks |
| --- | --- | --- | --- |
| Comparative Example 2 | — | 12.5 | No silicon nitride interlayer |
| Example 15 | 40 | 13.8 | a-Si/a-Si/interlayer/μc-Si structure, Interlayer (N concentration: 40 atomic %, $N_2/SiH_4$: 300), $N_2/SiH_4$ for bottom μc-Si p layer formation: 0.5 |

The invention claimed is:

1. A stacked photoelectric conversion device, comprising:
a first silicon-based photoelectric conversion layer having a p-i-n structure;
an interlayer mainly containing nitrogen atoms and silicon atoms; and
a second silicon-based photoelectric conversion layer having a p-i-n structure, the layers being stacked in this order,
wherein the first and second silicon-based photoelectric conversion layers are electrically connected with each other,
wherein a p-type silicon-based semiconductor layer constituting a part of the first or second silicon-based photoelectric conversion layer and contacting the interlayer contains nitrogen atoms, and
wherein a concentration of the nitrogen atoms contained in the p-type silicon-based semiconductor layer is distributed to gradually decrease from an interface between the p-type silicon-based semiconductor layer and the interlayer.

2. The device according to claim 1, wherein the interlayer has at least one aperture, and
the first and second silicon-based photoelectric conversion layers are electrically connected by contacting with each other via the aperture.

3. The device according to claim 1, wherein the p-type silicon-based semiconductor layer contains nitrogen atoms of 0.001 to 10 atomic %.

4. The device according to claim 1, wherein the interlayer contains nitrogen atoms of 10 to 60 atomic %.

5. The device according to claim 1, wherein the p-type silicon-based semiconductor layer is a hydrogenated silicon layer.

6. The device according to claim 5, wherein the hydrogenated silicon layer contains a crystalline silicon.

7. The device according to claim 2, wherein a width of a part where the interlayer contacts the p-type silicon-based semiconductor layer is 1 mm or less.

8. The device according to claim 1, wherein, of the first and second silicon-based photoelectric conversion layers, one at a light entrance side of the interlayer has an i-type hydrogenated amorphous silicon, and an other has an i-type hydrogenated microcrystalline silicon.

9. The device according to claim 8, wherein the first and second photoelectric conversion layers each having the i-type hydrogenated amorphous silicon are laminated at the light entrance side of the interlayer.

10. The device according to claim 2, wherein the interlayer is an insulating layer.

11. A method for producing a stacked photoelectric conversion device, comprising the steps of:
forming a first silicon-based photoelectric conversion layer having silicon-based semiconductor layers of p-type, i-type, and n-type on a substrate via a conductive film;
forming an interlayer mainly containing nitrogen atoms and silicon atoms on the first silicon-based photoelectric conversion layer; and
forming a second silicon-based photoelectric conversion layer having silicon-based semiconductor layers of p-type, i-type, and n-type on the interlayer in a same order as in the first silicon-based photoelectric conversion layer,
wherein the first and second silicon-based photoelectric conversion layers are formed to be electrically connected with each other,
wherein the p-type silicon-based semiconductor layer on the interlayer is formed to contain nitrogen atoms, and
wherein a concentration of the nitrogen atoms contained in the p-type silicon-based semiconductor layer is distributed to gradually decrease from an interface between the p-type silicon-based semiconductor layer and the interlayer.

12. The method according to claim 11, wherein
the interlayer has at least one aperture, and
the first and second silicon-based photoelectric conversion layers are electrically connected by contacting with each other via the aperture.

13. The method according to claim 11, wherein the interlayer is formed by a plasma CVD method using a material gas containing an $N_2$ gas and an $SiH_4$ gas, and a gas flow rate ratio of $N_2/SiH_4$ is 10 or more.

14. The method according to claim 11, wherein the interlayer is formed by a plasma CVD method using a material gas containing an $N_2$ gas and an $SiH_4$ gas, and a gas flow rate ratio of $N_2/SiH_4$ is in a range of 10 to 500.

15. The method according to claim 11, wherein the interlayer is provided with a p-type silicon-based semiconductor layer formed thereon, and the p-type silicon-based semiconductor layer is formed in a film forming chamber used for formation of the interlayer.

16. The method according to claim 15, wherein the p-type silicon-based semiconductor layer is formed by using a cathode electrode and an anode electrode used for the formation of the interlayer.

17. The method according to claim 12, wherein the interlayer is an insulating layer.

18. A photoelectric conversion device, comprising:
a transparent conductive layer formed on a transparent substrate;
a first photoelectric conversion layer formed on the transparent conductive layer;
an insulating interlayer formed on the first photoelectric conversion layer so as to be in contact with the first photoelectric conversion layer, the insulating interlayer comprising one or more apertures;
a second photoelectric conversion layer formed on the insulating interlayer so as to be in contact with the insulating interlayer and to be in to be electrically connected to the first photoelectric conversion layer via the one or more apertures of the insulating interlayer; and
a back electrode formed on the second photoelectric conversion layer,
wherein the first photoelectric conversion layer comprises p-type and n-type semiconductor layers with an intrinsic semiconductor layer formed therebetween,
wherein the second photoelectric conversion layer comprises p-type and n-type semiconductor layers with an intrinsic semiconductor layer formed therebetween,
wherein the p-type semiconductor layer of the first or the second photoelectric conversion layer in contact with the insulating interlayer is formed of a material containing nitrogen atoms,
wherein a concentration of the nitrogen atoms contained in the p-type semiconductor layer is distributed to gradually decrease from an interface between the p-type semiconductor layer and the insulating interlayer, and
wherein the insulating interlayer is formed of a material containing nitrogen and silicon atoms.

19. The photoelectric conversion device according to claim 18, wherein widths of the one or more apertures are substantially 1 mm or less.

* * * * *